United States Patent [19]
Schuele et al.

[11] Patent Number: 5,930,639
[45] Date of Patent: Jul. 27, 1999

[54] METHOD FOR PRECISION ETCHING OF PLATINUM ELECTRODES

[75] Inventors: Paul Schuele; Brent A. McClure; Thomas M. Graettinger, all of Boise, Id.

[73] Assignee: Micron Technology, Inc., Boise, Id.

[21] Appl. No.: 08/631,290

[22] Filed: Apr. 8, 1996

[51] Int. Cl.⁶ .................................................. H01L 21/20
[52] U.S. Cl. ................ 438/396; 438/3; 438/240
[58] Field of Search .................. 216/67, 69, 70, 216/76, 77, 94; 148/DIG. 131, DIG. 147; 438/669, 712, 720, 734, 745, 719, 3, 239, 240, 250, 393, 396; 204/192.32

[56] References Cited

U.S. PATENT DOCUMENTS

| | | | |
|---|---|---|---|
| 4,025,411 | 5/1977 | Hom-Ma et al. | 204/192.32 |
| 4,350,729 | 9/1982 | Nakano et al. | 428/209 |
| 4,444,618 | 4/1984 | Saia et al. | 216/67 |
| 4,863,559 | 9/1989 | Douglas | 438/720 |
| 5,108,542 | 4/1992 | Lin | 438/720 |
| 5,185,058 | 2/1993 | Cathey et al. | 438/720 |
| 5,270,259 | 12/1993 | Ito et al. | 438/712 |
| 5,294,294 | 3/1994 | Namose | 438/712 |
| 5,397,432 | 3/1995 | Konno et al. | 438/712 |
| 5,405,806 | 4/1995 | Pfiester et al. | 438/649 |
| 5,515,984 | 5/1996 | Yokoyama et al. | 438/3 |
| 5,599,743 | 2/1997 | Nakagawa et al. | 438/720 |
| 5,614,438 | 3/1997 | Evans, Jr. et al. | 438/240 |
| 5,651,856 | 7/1997 | Keller et al. | 216/67 |
| 5,670,019 | 9/1997 | Huang et al. | 216/67 |
| 5,834,348 | 11/1998 | Kwon et al. | 438/3 |
| 5,840,200 | 11/1998 | Nakagawa et al. | 438/717 |

*Primary Examiner*—Tuan H. Nguyen
*Attorney, Agent, or Firm*—Workman, Nydegger & Seeley

[57] ABSTRACT

Disclosed is a method for precision etching of films on in-process integrated circuit wafers. The method is particularly useful for etching films comprising noble metals and is advantageous for use in constructing capacitor electrodes. The method comprises depositing a titanium nitride hard mask over the film to be etched, and thereafter patterning the titanium nitride hard mask with an etchant which is selective to titanium nitride and unselective to the underlying film. The film is then etched using either ion beam milling or reactive ion etching with oxygen as an etching agent. Both etches are highly selective to titanium nitride such that the titanium nitride hard mask can be very thin compared to the film. The presence of the titanium nitride hard mask reduces redeposition problems. Critical dimension control and substantially vertical sidewalls also result from the use of the titanium nitride hard mask.

37 Claims, 10 Drawing Sheets

METHOD FOR PRECISION ETCHING OF PLATINUM ELECTRODES

This invention was made with Government Support under Contract Number MDA 97294-C-0006 awarded by Advanced Research Projects Agency (ARPA). The Government has certain rights in this invention.

BACKGROUND OF THE INVENTION

1. The Field of the Invention

The present invention relates to precision etching methods. More particularly, the present invention is directed to a method of precisely etching noble metal films with physical ion etching which is capable of forming high density capacitor electrodes in integrated circuit memory structures.

2. The Relevant Technology

The miniaturization of semiconductor devices has long been a major focus of the integrated circuit manufacturing industry. The semiconductor devices which are being progressively miniaturized include active devices such as transistors and capacitors, as well as resistors, interconnect lines, inter-level contacts, and the many other structures necessary to complete the highly complex integrated circuits currently in demand. This miniaturization has resulted in increasingly compact and efficient integrated circuit chips. It has also been accompanied by an increase in the complexity and number of such semiconductor devices aggregated on a single semiconductor integrated circuit chip.

As the size of various geometric features of semiconductor devices are reduced, new problems arise which must be solved in order to continue to economically and reliably produce integrated circuit chips.

As an example, DRAM memory structures are one type of integrated circuit for which problems must be overcome in order to achieve increased miniaturization and integration levels. One advance which is facilitating the increased miniaturization of memory structures is the use of platinum, a highly conductive and non-reactive material, for the formation of capacitor electrodes. Capacitors are a major component of memory structures such as DRAMs, and are used in many other functions of integrated circuits as well. One type of capacitor which utilizes platinum electrodes is the high dielectric constant capacitor. Ferroelectric capacitors, a specialized form of high dielectric constant capacitor having the capability of reversing polarity, are also being formed with platinum electrodes.

Figure 1:
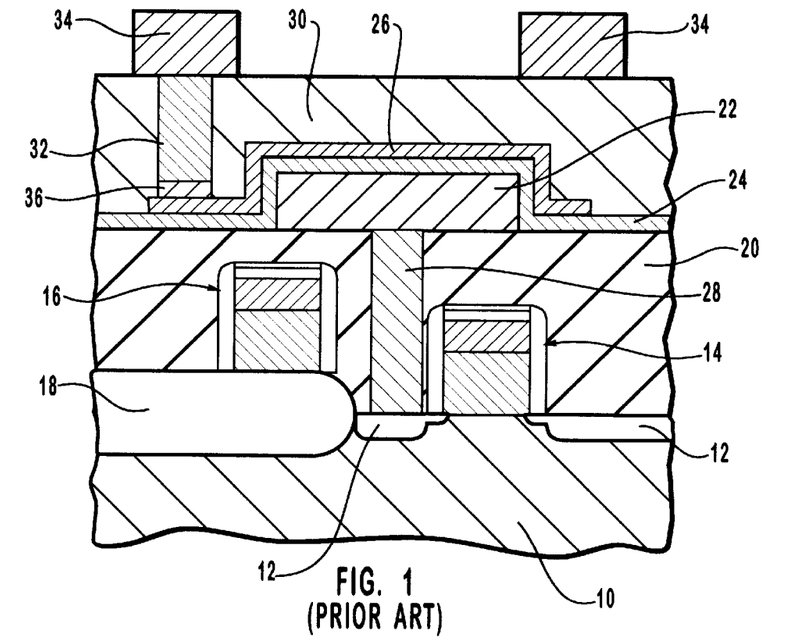
FIG. 1 is a cross-sectional depiction of a MOS stacked memory structure of the prior art utilizing a high dielectric constant capacitor constructed with platinum capacitor electrodes.

FIG. 1 of the accompanying drawings shows the basic structure of a typical MOS stacked memory structure. As one part of the memory structure, there can be seen a DRAM memory cell, central to which is a high dielectric constant capacitor formed with platinum electrodes. The memory cell includes a silicon substrate 10, above which is formed a pair of active regions 12. A gate region 14 is formed above active regions 12, and an oxide barrier layer 18 having formed on its top surface a word line 16 is located adjacent thereto. Covering these structures is an oxide isolation layer 20, above which is located a lower capacitor electrode 22, which is formed of platinum. Also shown in FIG. 1 is a polysilicon plug 28 which connects lower capacitor electrode 22 and one of the active regions 12. Formed above lower capacitor electrode 22 is a dielectric layer 24. Above dielectric layer 24 is formed an upper capacitor electrode 26 which is also formed of platinum. A planarized passivation layer 30 is located above upper capacitor electrode 26. Extending through passivation layer 30 is a tungsten plug 32. Tungsten plug 32 connects upper capacitor electrode 26 with one of two metal interconnect lines 34. A diffusion barrier layer 36 prevents tungsten plug 32 and upper capacitor electrode 26 from reacting together.

Certain problems are incurred by the use of platinum in forming capacitor electrodes and arise from the need to precisely etch the platinum into the shape of the desired capacitor electrodes. The etching process, which is repeated many times over in the formation of integrated circuit chips, typically comprises at least in part the use of a chemical etchant which reacts with and removes the film or layer being etched. Noble metals such as platinum, however, are not highly reactive with chemical etchants, and consequently require the use of specialized forms of etching. The two methods which are currently used for etching platinum and other noble metals comprise ion beam milling and reactive ion etching (RIE). These processes and other such processes which use ions to physically bombard and thereby etch the film will hereafter collectively be referred to as "physical ion etching."

Ion beam milling comprises a magnetically confined RF or DC plasma which is typically used to generate ions. A semiconductor wafer is physically separated from the plasma in the etch chamber, and a broad ion beam extracted from the plasma is collimated and accelerated to impinge on the wafer surface in a definite direction with respect to the feature to be etched. A magnetic field is often used to force the electrons to follow a helical path between collisions, rather than pass directly from cathode to anode, enhancing the electron path length and ion efficiency at low pressure. A set of grids are also used to extract ions from a source and to direct an ion beam to the wafer surface.

Reactive ion etching typically involves the use of plasma ions in a parallel plate RF reactor to provide a source of energetic particle bombardment of the etched surface. Ion bombardment increases the reaction rate of spontaneously occurring processes and may also prompt reactions which do not occur without radiation. Normally, horizontal surfaces are subjected to both reactive species and impinging ions, while vertical sidewalls are only subjected to reactive species. In the etching of noble metals which are not highly reactive, however, oxygen is typically used as the etchant, and only the physical ion bombardment aspect of reactive ion etching occurs. Consequently, RIE for noble metals is actually a generalized form of ion beam milling.

Physical ion etching processes are advantageous in their ability to etch virtually any material which may be formed on a wafer surface. Nevertheless, certain highly detrimental problems with physical ion etching, and especially when used in the formation of capacitor electrodes, continue to exist. These include the occurrence of redeposition during the etching process. Redeposition involves the tendency of the noble metal to not be volatilized after being etched by the ions, but instead to be redeposited onto the wafer surface and elsewhere in the system. This tendency is illustrated in FIG. 2, which shows a platinum layer 38 being etched by physical ion etching to form a lower capacitor electrode 22.

Figure 2:
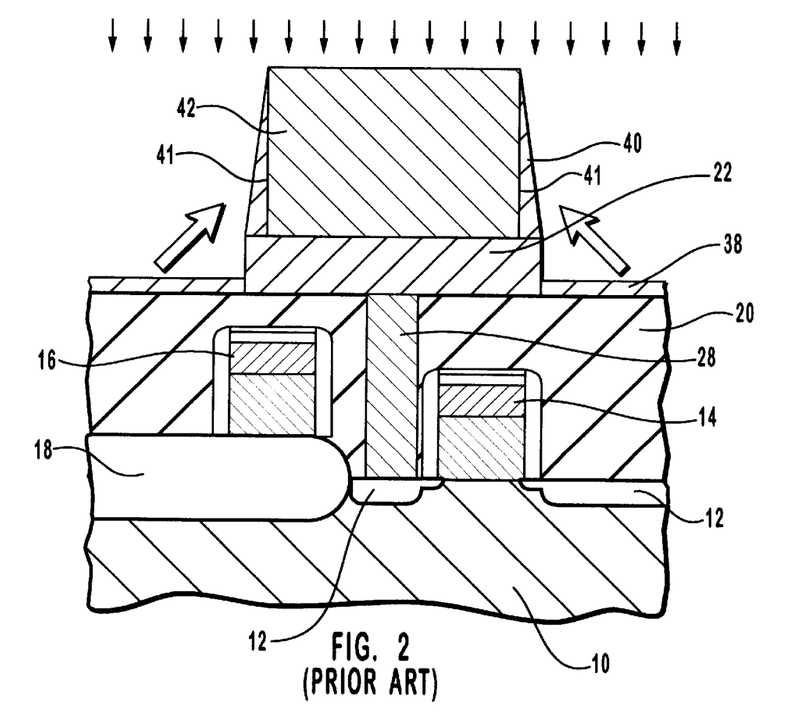
FIG. 2 is a cross-sectional depiction of a prior art method of forming capacitor electrodes of the MOS stacked memory structure of FIG. 1, shown in a stage of the method wherein a physical ion etch is taking place using a masking layer of photoresist material.
Figure 3:
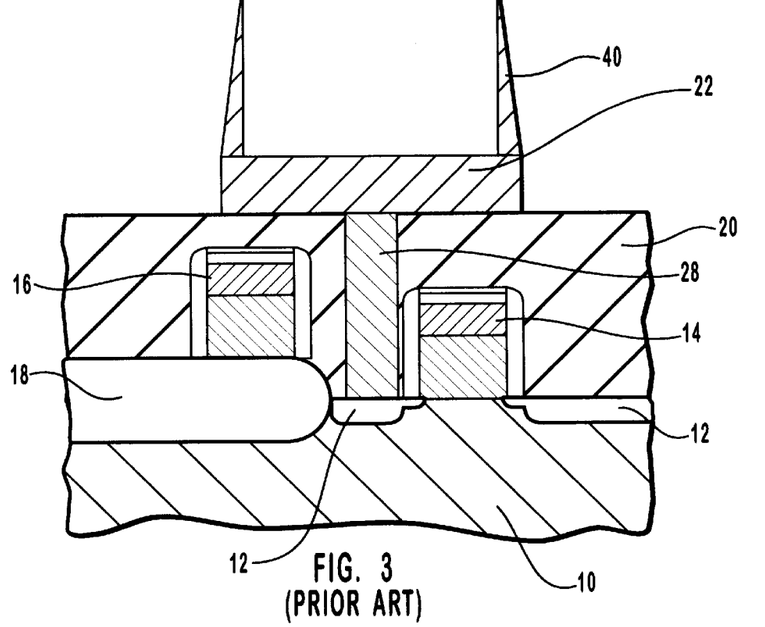
FIG. 3 is a cross-sectional depiction of the prior art method of FIG. 2 subsequent to the photoresist material being removed and showing undesired redeposition ears.

A patterned photoresist mask 42 is being used to shield the portions of platinum layer 38 which are desired not to be etched, which is lower capacitor electrode 22 seen in FIG. 2. Directional arrows show one direction of emission of the platinum atoms as they are dislodged from platinum layer 38 by the energy of impinging ions from the physical ion etch process. The dislodged platinum atoms come to rest on any surface in their path. One such surface is the sidewall 41 of photoresist mask 42. Consequently, redeposition "ears" or other features are formed on photoresist mask sidewall 41, and remain when photoresist mask 42 is removed, as depicted in FIG. 3. Therein, redeposition ears 40 are shown formed above lower capacitor electrode 22. The size and shape of the redeposition features are determined by the height and slope of the photoresist mask sidewall 41. A shorter sidewall or one with a greater slope will provide less of a surface on which redeposition features can form. Redeposition can cause several rather severe problems, two of which are illustrated in FIGS. 4 and 5.

Figure 4:
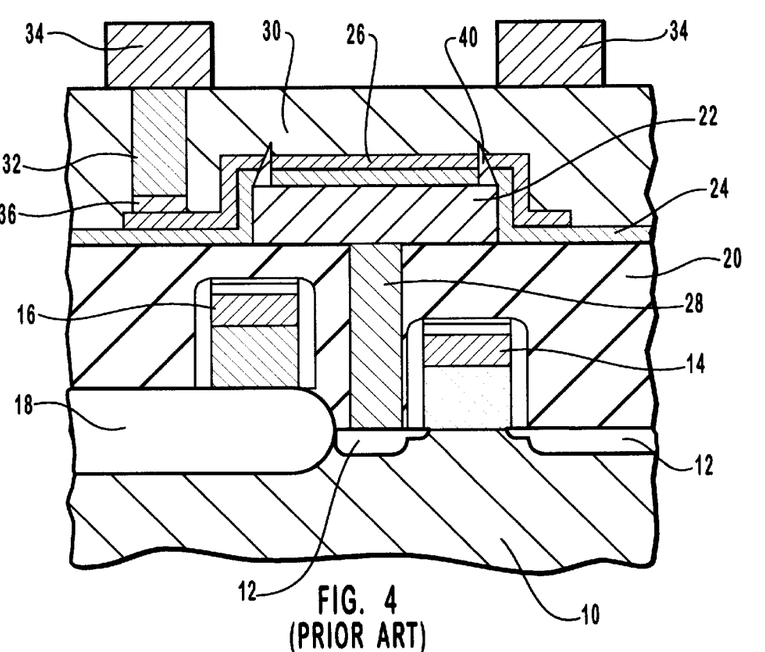
FIG. 4 is a cross-sectional depiction of the prior art method of FIGS. 2 and 3 shown subsequent to an inter-metal dielectric and an upper capacitor electrode being deposited, and illustrating the problem of shorting due to the occurrence of redeposition.

In FIG. 4, the memory cell has been completed and is shown to be similar to the memory cell of FIG. 1, with the exception of redeposition ears 40 penetrating through dielectric layer 24 and shorting out lower capacitor electrode 22 and upper capacitor electrode 26. While an extreme case is shown for illustration purposes, even shorter ears which do not totally penetrate dielectric layer 24 will increase leakage currents and can cause the capacitor to fail to hold a charge for a sufficient amount of time. The failure to hold a charge is a failure condition which can cause device failure, and can even cause failure of the whole die, the whole wafer, or a batch of wafers where the problem depicted occurs on all wafers to a problematic degree. Consequently, the yield rate of the integrated circuit manufacturing process can be dramatically reduced.

Figure 5:
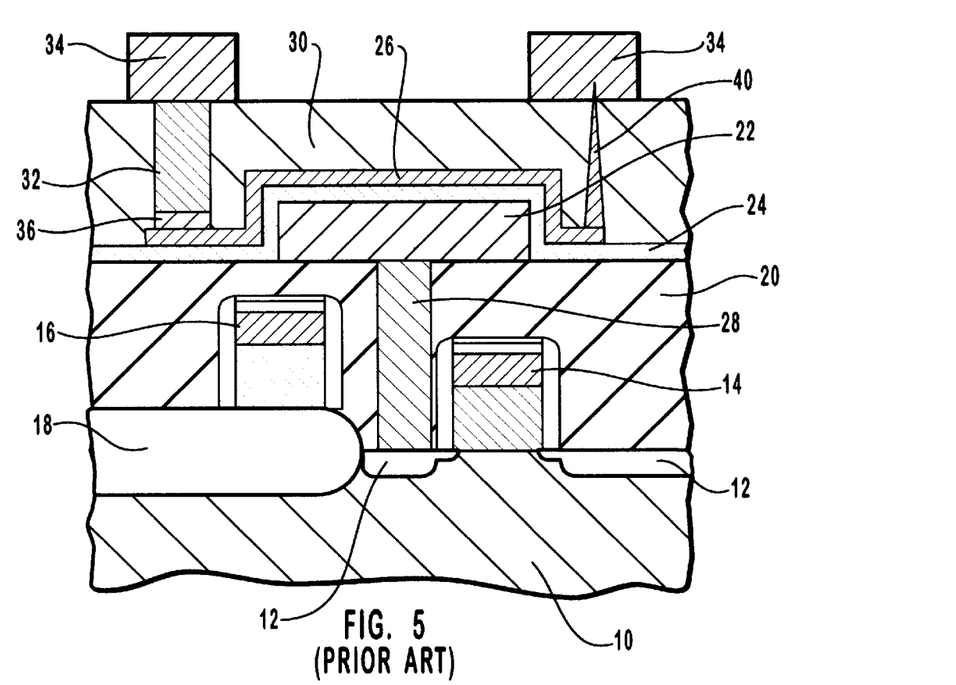
FIG. 5 is a cross-sectional depiction of a structure resulting from the prior art method of FIGS. 2 through 4 showing shorting problems due to the occurrence of redeposition on an upper capacitor electrode.

Platinum redeposition during the formation of upper capacitor electrode 26 can also lead to shorts between upper capacitor electrode 26 and metal interconnect lines 34, as shown in FIG. 5. Furthermore, redeposition features can break free from capacitor electrodes 22 and 26 during subsequent processing and be deposited elsewhere on the wafer, often causing shorts between adjacent capacitor electrodes, and also resulting in a failure condition.

An additional problem arising from physical ion etching of noble metals comprises poor critical dimension control of the etching process. In order to produce high density memory structures where capacitors are arrayed side by side with narrow boundaries between them, the tolerances of the separating boundaries between the capacitors must be tightly controlled. The problem with many forms of ion etching is that not only is the noble metal layer etched, but the photoresist material which typically masks the layer is also etched at a substantial rate. This causes the sides of the photoresist mask to shrink, and as a result, the underlying features which were intended to be masked will be etched beyond their intended critical dimensions. A consequence of poor critical dimension control is that the capacitor electrodes being formed will be spaced further apart than desired. This results in decreased device density on the integrated circuit, which in turn reduces the amount of chips that can be formed on a single wafer.

A further problem that arises with physical ion etching is the inability to maintain vertical sidewalls. As the photoresist mask is etched away at the sides, the etchant is given greater and greater access to the sidewalls of the capacitor electrode being etched. This results in rounding or sloping of the capacitor electrode sidewalls. This is undesirable, in that capacitor electrodes with straight sidewalls produce higher capacitance with a lower volume of material. This becomes important in memory structures, where the volume of material in the capacitor electrode is desired to be minimized, both for space savings and because platinum is costly. It is also desired that the capacitor electrode be shorter, as taller electrode heights necessitate more expensive interconnecting structures. Electrodes with vertical sidewalls can be made shorter and will still maintain proper charge rates. Consequently, the inability of physical ion etching to produce vertical sidewalls is also a substantial drawback in the art.

Figure 6:
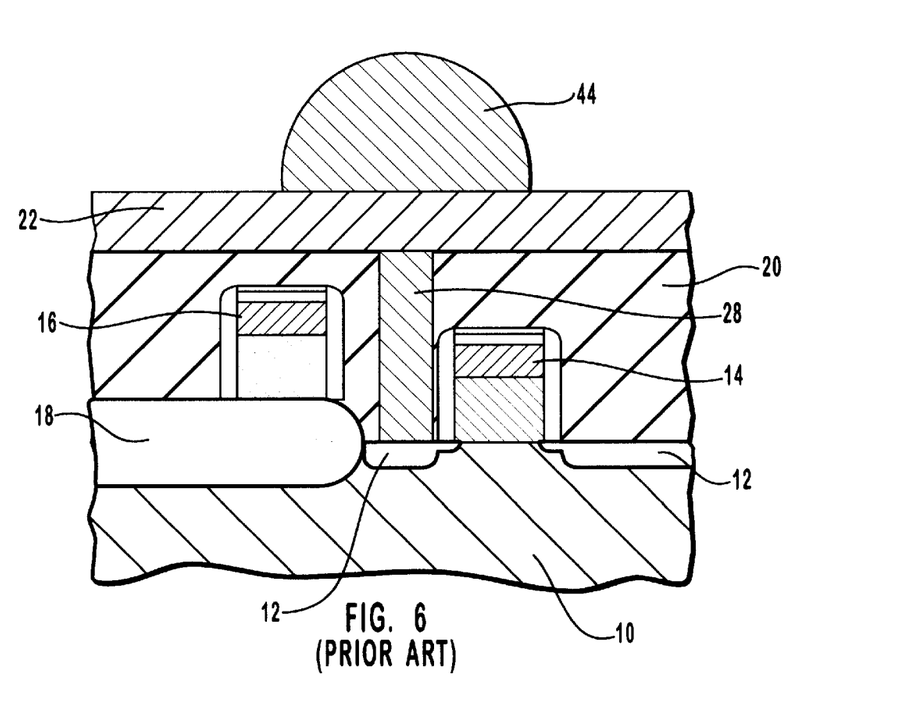
FIG. 6 is a cross-sectional depiction of an additional prior art method of forming platinum capacitor electrodes in a MOS stacked memory structure showing a platinum layer covered with a rounded photoresist mask.
Figure 7:
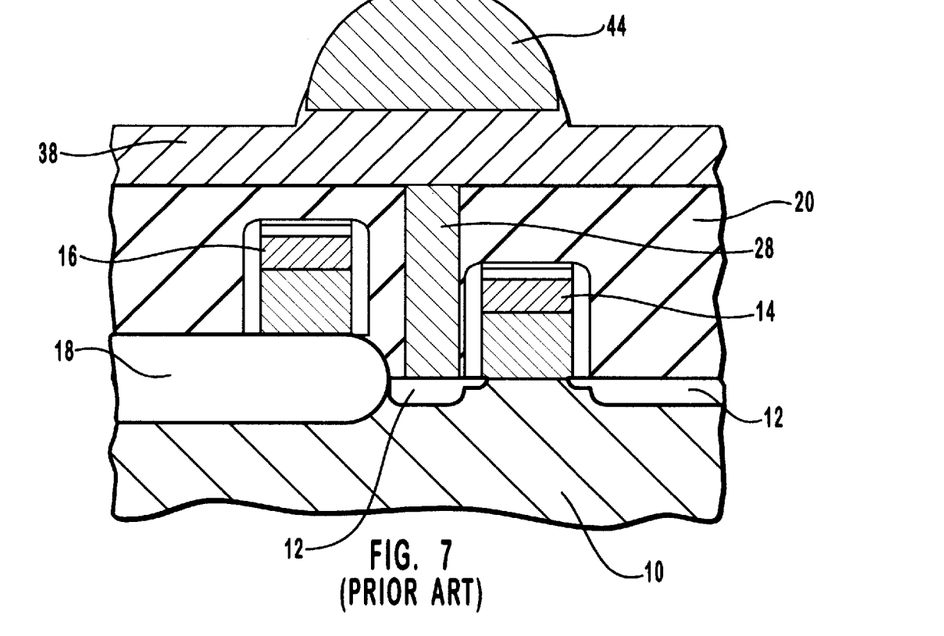
FIG. 7 is a cross-sectional depiction of the prior art method of FIG. 6 shown during physical ion etching of the platinum layer of FIG. 6.
Figure 8:
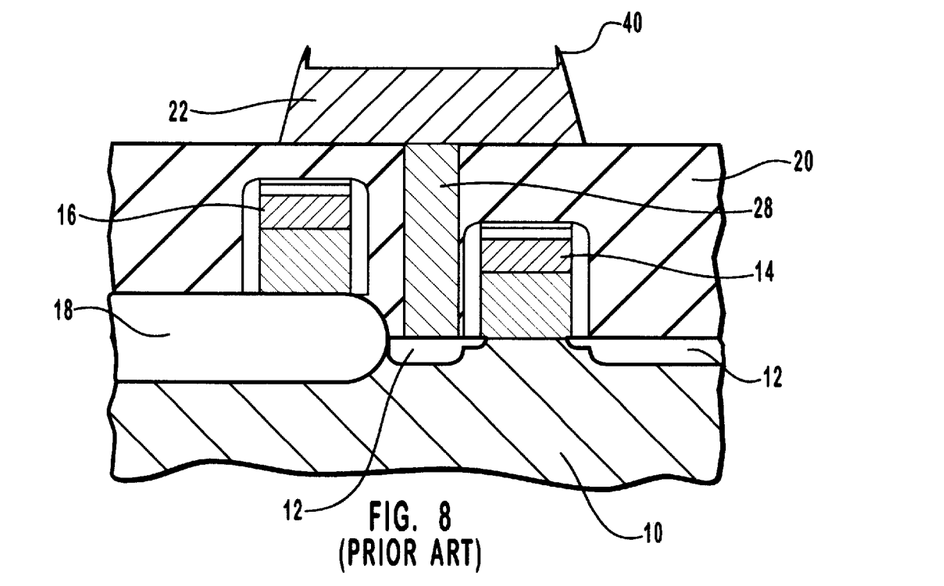
FIG. 8 is a cross-sectional depiction of the prior art method of FIGS. 6 and 7 shown subsequent to the photoresist removal and illustrating the problems of sloping sidewalls and redeposition ears.

Attempts have been made in the art to overcome the above-recited problems. These include the processes of FIGS. 6 through 8 and of FIGS. 9 through 11. FIG. 6 depicts the initial state of an etch process in which a photoresist mask 44 has been heated and deformed into a rounded shape in an attempt to avoid the occurrence of redeposition. In FIG. 7, where etching is under way, redeposition is seen at the periphery of photoresist mask 44. In FIG. 8, where the etch is completed and photoresist mask 44 has been removed, slight redeposition still occurs, and presents itself in the form of redeposition ears 40. Also, the resulting capacitor electrode will be formed with sloped sidewalls, not the desired vertical sidewalls. A further problem with this method is that it is extremely size sensitive, as it has proven difficult to heat the photoresist masks into the proper rounded shape at smaller sizes.

Figure 9:
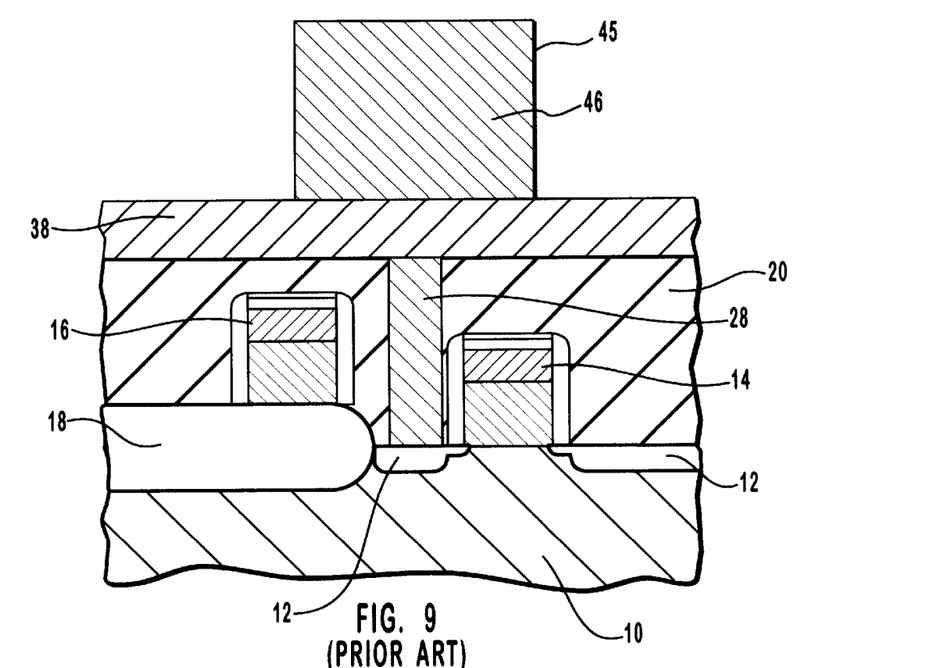
FIG. 9 is a cross-sectional depiction of a further prior art method showing a MOS stacked memory structure having formed thereon a photoresist layer.
Figure 10:
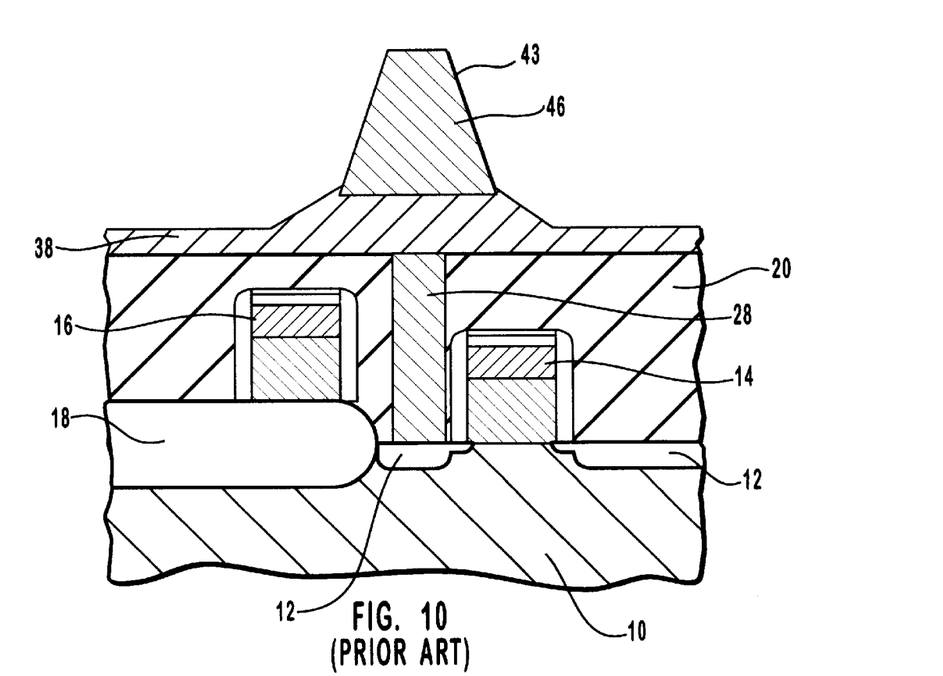
FIG. 10 is a cross-sectional depiction of the prior art method of FIG. 9 shown during a physical ion etch process wherein the photoresist layer sidewall is being eroded by the etchant.
Figure 11:
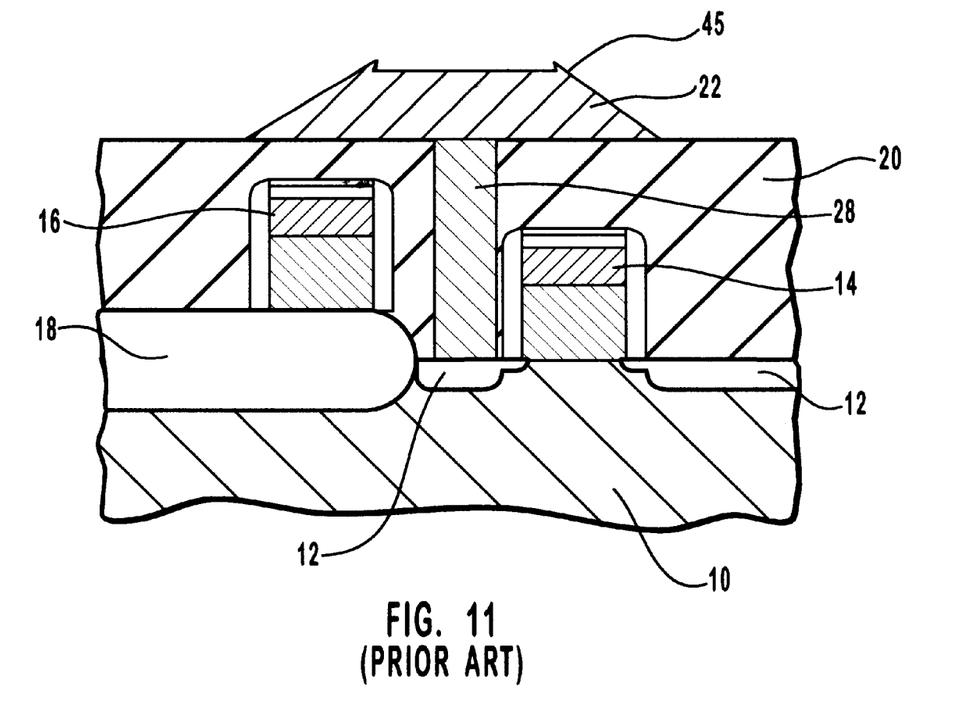
FIG. 11 is a cross-sectional depiction of the prior art method of FIGS. 9 and 10 shown after the removal of the photoresist layer and illustrating the problems of sloping sidewalls and redeposition ears.

In FIG. 9, platinum layer 38 is being etched with a prior art process, whereby the sidewalls 45 of photoresist mask 46 are progressively eroded away so that they cannot support redeposition structures. FIG. 10 shows the etch in process, with sloped sidewalls 43 of photoresist mask 46 being continuously removed. Continuous etching of sidewalls 43 of photoresist mask 46 decreases the redeposition problem of platinum layer 38 seen in FIG. 10, but does not totally eliminate it. This is largely due to the fact that it is difficult to coordinate the etch rates of photoresist mask 46 and underlying platinum layer 38 to etch both at the same rate. Furthermore, detrimental side effects result from this method. The resulting capacitor plate 22, shown in FIG. 11, has capacitor electrode sidewalls 45 which are sloped as shown, and are not vertical as is desirable. Critical dimension control is also difficult to maintain under this process, due to the continuous etching of capacitor electrode sidewalls 45.

From the above discussion, it is apparent that a method is needed for etching noble metals, and particularly for physical ion etching of platinum, that avoids the problems of redeposition, poor critical dimension maintenance, and sloping sidewalls. Such a method is further needed with which capacitor electrodes can be formed to have high capacitance, lower tolerances, greater device densities, and less metal volume.

SUMMARY AND OBJECTS OF THE INVENTION

The present invention seeks to resolve the above and other problems which have been experienced in the art. More particularly, the present invention constitutes an advancement in the art by providing a method for precision etching of films which achieves each of the objects listed below.

It is an object of the present invention to provide a method for etching films that can be used to effectively pattern noble metals.

It is also an object of the present invention to provide such a method that can be used to form capacitor electrodes, and especially platinum electrodes for capacitors in MOS memory structures.

It is another object of the present invention to provide such a method that can be used to form capacitor electrodes without the occurrence of redeposition ears and without shorting out the capacitor and adjacent features or resulting in excessive current leakage.

It is likewise an object of the present invention to provide such a method that can form substantially vertical sidewalls in the film being etched, in order to result in proper capacitance levels with a minimum of capacitor electrode volume and height.

It is yet another object of the present invention to provide such a method which, when forming capacitor electrodes, results in high critical dimension control for greater device density and performance.

It is further an object of the present invention to provide a hard mask for use in physically etching films, which can be allowed to remain in place after etching to serve as a diffusion barrier between the films and subsequently deposited materials.

To achieve the foregoing objects, and in accordance with the invention as embodied and broadly described herein in the preferred embodiment, a method is provided for the precision etching of films such as noble metals which can be used to form capacitors without the occurrence of redeposition ears and in a manner which results in substantially vertical sidewalls and high critical dimension control. The present invention involves the use of a metal nitride layer which is deposited and patterned over a film to be etched and serves as a hard mask during the etching process. In one embodiment, the film comprises platinum, the metal nitride layer comprises titanium nitride, and the etching process comprises a physical ion etch such as reactive ion etching with oxygen or ion beam milling. This embodiment will be described herein as used for an application of patterning a platinum layer with physical ion etching in order to form capacitor electrodes in a stacked MOS memory structure.

When forming a lower capacitor electrode, a layer of platinum preferably of a thickness in a range of about 1000 angstroms to 3000 angstroms is formed on a silicon substrate. Next, a layer of titanium nitride having a thickness in a range of about 100 angstroms to about 200 angstroms is formed over the platinum layer. A photoresist pattern is then formed by photolithography over the titanium nitride layer in the shape of the lower capacitor electrode which is to be formed. The photoresist pattern should have the same planar dimensions (e.g. length and width) as the lower capacitor electrode to be formed. The titanium nitride layer is then etched with an appropriate method, such as chlorine or fluorine-based reactive ion etching, or such as a wet etch of $H_2O_2:H_2SO_4$ with a ratio of 8 to 1 or $H_2O_2:NH_4OH$ with a ratio also of 8 to 1. The titanium nitride etch process will minimally etch platinum and, as a result, the etch stops when it reaches the platinum layer. Due to the high selectivity of the etch to the titanium nitride as opposed to platinum, very little titanium nitride overetch is required. Thus, the dimensions of the titanium nitride features can be formed to match the pattern of the photoresist, and the titanium nitride should also have the same planar dimensions (e.g. length and width) as the lower capacitor electrode to be formed.

The photoresist pattern is then removed, and the platinum capacitor electrode is ethed using an oxygen based ion milling or reactive ion etching step. As the etch rate of platinum using oxygen is much higher than that of titanium nitride, the patterned titanium nitride layer acts as a hard mask for the platinum etch. Also, because the titanium nitride hard mask is very thin and is partially consumed in the etching process, no surface is provided for redeposition features to form, and redeposition of platinum on the titanium nitride layer is minimized. Once the platinum layer is etched, the remainder of the titanium nitride layer is removed using a chlorine or fluorine-based RIE etch or a wet etch.

When forming an upper capacitor electrode, the method is similar to that described above. First, a dielectric or ferroelectric layer is deposited over the lower capacitor electrode. A platinum layer having a thickness in a range of about 500 angstroms to about 1500 angstroms is then deposited over the dielectric or ferroelectric layer. A titanium nitride layer having a thickness in a range of about 300 angstroms to about 500 angstroms is then deposited as a hard mask. A photoresist pattern is next formed over the titanium nitride layer, and the titanium nitride layer is then patterned using RIE or wet etching as discussed above, which etch stops on the platinum layer. The photoresist mask is then removed, and the platinum upper capacitor electrode is etched using ion beam milling or a RIE process as also discussed above.

The remainder of the titanium nitride layer is, in one embodiment, left in place to act as a diffusion barrier between the platinum upper capacitor electrode and subsequently formed metal interconnect layers. Allowing the titanium nitride hard mask to remain in place protects the capacitor during processing, preventing the platinum upper capacitor electrode and the plug from interdiffusing. In a further step, a silicon dioxide isolation layer is deposited above the memory structure and is planarized. A contact opening is then etched and filled with tungsten or aluminum to form a plug which is connected to other structures in the circuit by metal interconnect lines (e.g. aluminum interconnect lines) which complete the memory structure.

From the foregoing discussion, it can be seen that a method is provided for etching noble metals, which results in the formation of substantially no redeposition features, and which forms substantially vertical sidewalls. Furthermore, the method provides a high degree of critical dimension control. A resulting capacitor structure can be formed therewith having increased device density and better performance than capacitor structures formed with the methods of the prior art.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings listed below.

DETAILED DESCRIPTION OF THE PREFERRED EMBODIMENTS

The present invention involves the discovery by the inventors that physical ion etching of films, including noble metals such as platinum, can be conducted in a manner which avoids many of the problems encountered in the prior art. In accordance with this discovery, the physical ion etching of films is accomplished with the use of a patterned metal nitride layer positioned over the film during the etching process for use as a hard mask as a complement to the conventional photoresist mask. The present invention will be illustrated in FIGS. 12 through 18 in an embodiment wherein the lower and upper platinum capacitor electrodes of a capacitor in a MOS stacked memory structure are being formed.

Figure 12:
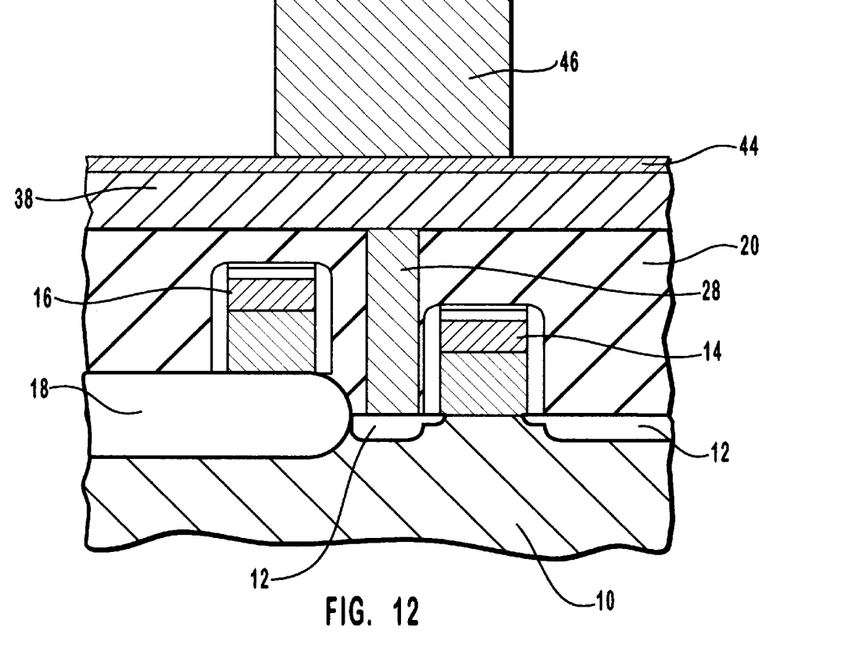
FIG. 12 is a cross-sectional depiction of a MOS stacked memory structure being formed under the method of the present invention. The MOS stacked memory structure is shown being formed with a platinum layer covered with a titanium nitride layer and an overlying patterned photoresist mask.

Shown in FIG. 12 is a MOS stacked memory structure, similar to the memory structure described in conjunction with FIG. 1, above. The MOS stacked memory structure is shown in a stage of the production process wherein it has been provided with a platinum layer 38 from which a lower capacitor electrode is to be formed. Accordingly, a first step of the method of the present invention comprises providing the film to be etched, in this case, platinum layer 38. In the illustrated embodiment, platinum layer 38 is deposited over insulating layer 20 and is connected with an active region 12 on a silicon substrate 10 by a polysilicon plug 28. Platinum layer 38 in this embodiment is preferably of a thickness of between about 1,000 and about 3,000 angstroms and can be deposited using any known method.

In a further step of the method of the present invention, a metal nitride layer is formed above platinum layer 38. The metal component of the metal nitride can comprise any metal, but titanium, aluminum, and tantalum are preferred for their high selectivity in the subsequent electrode etch step. In this embodiment, the metal component comprises titanium, and thus the metal nitride layer comprises a titanium nitride layer 44. Titanium nitride layer 44 can be formed using any known method and typically has a thickness in a range of about 100 angstroms to about 200 angstroms. Titanium nitride layer 44 can be much thinner than the photoresist masks of the prior art, such as photoresist mask 42 shown in FIG. 2. This is largely due to the high selectivity of the physical ion etch process to titanium nitride layer 44 as opposed to platinum layer 38 during the electrode etch step. In fact, the selectivity of physical ion etching of titanium nitride to platinum has been found to be approximately 30 to 1.

In a further step, titanium nitride layer 44 is patterned in the desired shape of a capacitor electrode. This can be done with the use of photolithography to form a photoresist mask 46. Because titanium nitride layer 44 is not substantially etched in a lateral direction, photoresist mask 46 can be formed with substantially the same exact lateral dimensions with which lower capacitor electrode 22 is desired to be formed.

Figure 13:
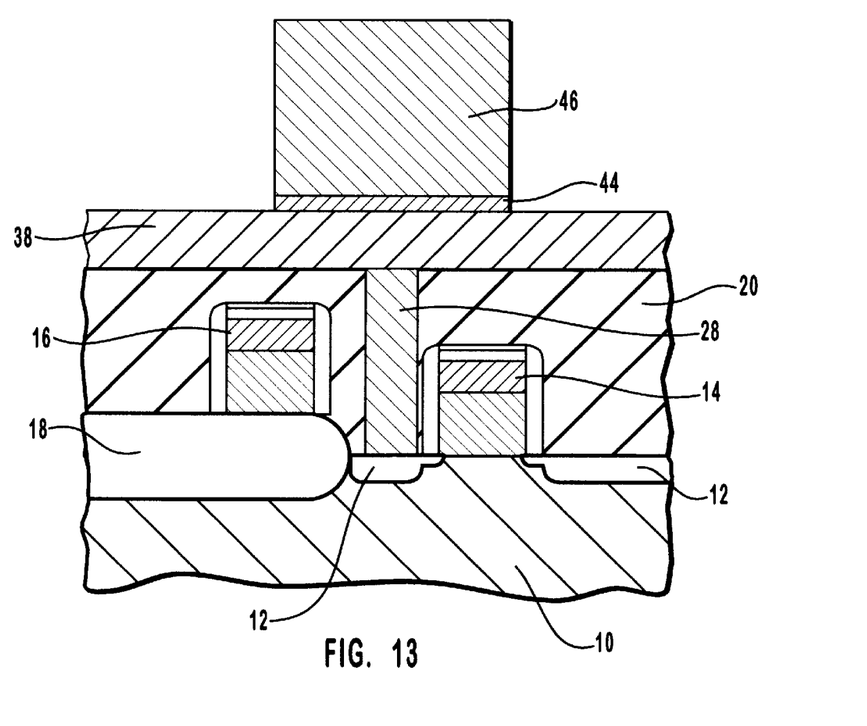
FIG. 13 is a cross-sectional depiction of a MOS stacked memory structure being formed with the method of the present invention and is shown after patterning of the metal nitride layer.

The next step in the method of the present invention comprises etching titanium nitride layer 44 to form a hard mask having approximately the same lateral dimensions of the capacitor electrode being formed. As shown in FIG. 13, and in the preferred embodiment, this comprises etching titanium nitride layer 44 using an appropriate method which is selective to platinum layer 38. One such method comprises the use of a chlorine or fluorine-based RIE etch or a wet etch of $H_2O_2:H_2SO_4$ with a ratio of about 8 to 1 or $H_2O_2:NH_4OH$ with a ratio of about 8 to 1. Because these particular etch chemistries are selective to titanium nitride, platinum layer 38 will not be significantly etched. As a result, very little titanium nitride overetch is required, and the dimensions of the etched titanium nitride features will match the pattern of photoresist mask 46. When metal nitride hard masks other than titanium nitride are used, the etchant should likewise be chosen to be selective to the particular metal nitride and unselective to the electrode material being used.

Figure 14:
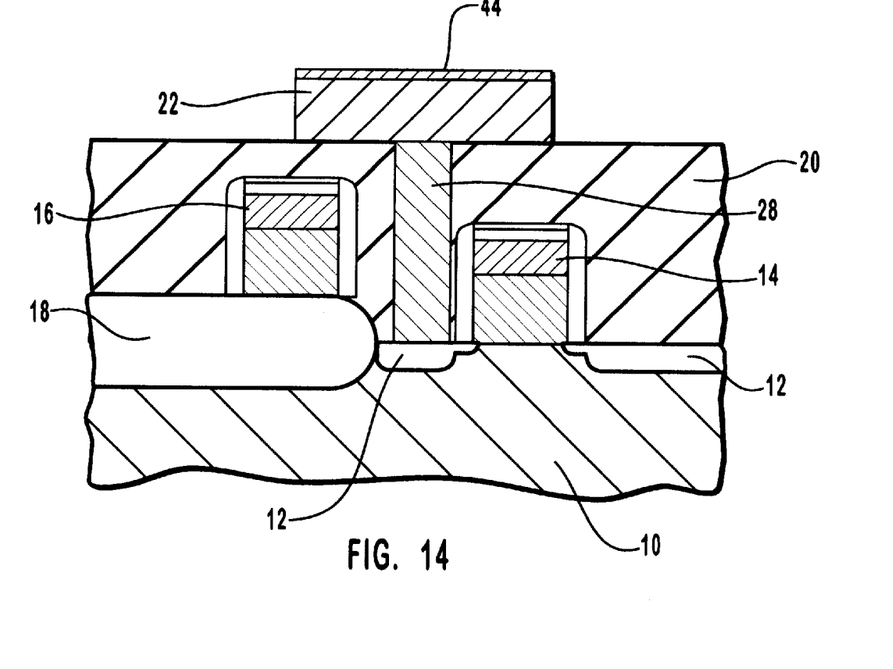
FIG. 14 is a cross-sectional depiction of a MOS stacked memory structure being formed with the method of the present invention and is shown subsequent to the removal of the photoresist layer and subsequent to the etching of platinum.

In the next step, photoresist mask 46 is removed, and platinum layer 38 is etched using an ion milling or oxygen based RIE step, with titanium nitride layer 44 serving as a hard mask in the manner shown in FIG. 14. Ion milling is preferred over RIE etching as it is more directed. Due to the high etch rate of platinum as compared to titanium nitride by these processes, titanium nitride layer 44 can be very thin as described above. Because of the thinness of titanium nitride layer 44, and because titanium nitride layer 44 is partially consumed in the etching process, very little surface area remains for redeposition of platinum on titanium nitride layer 44. Thus, the problems resulting from redeposition are substantially avoided. After platinum layer 38 is etched and the remainder of titanium nitride layer 44 can be removed using a chloride or fluorine-based RIE etch or a wet etch.

Figure 15:
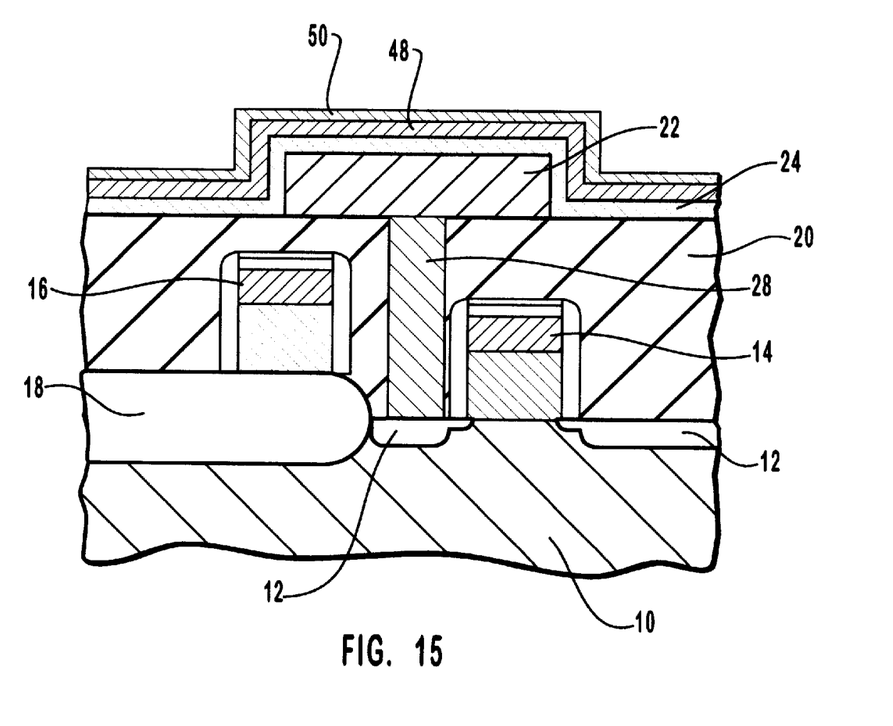
FIG. 15 is a cross-sectional depiction of a MOS stacked memory structure undergoing the method of the present invention and is shown after deposition of a capacitor dielectric, a second platinum layer, and an overlying layer of titanium nitride.
Figure 16:
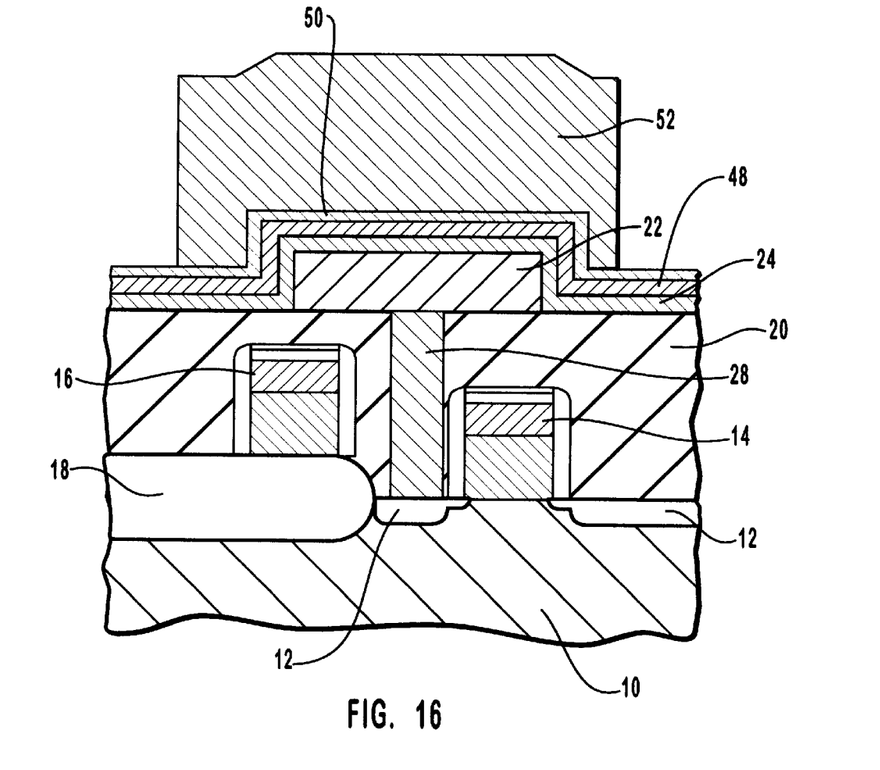
FIG. 16 is a cross-sectional depiction of a MOS stacked memory structure undergoing the method of the present invention and is shown with an overlying patterned photoresist layer.

The use of the method of the present invention to form an upper platinum capacitor electrode, is illustrated in FIGS. 15 through 18. As shown in FIG. 15, a dielectric or ferroelectric layer 24 is first deposited over lower capacitor electrode 22, which has been formed in accordance with the foregoing discussion, and a platinum layer 48 of about 1500 angstroms thick is then deposited over dielectric or ferroelectric layer 24. A titanium nitride layer 50 of approximately 300 to about 500 angstroms thick is then deposited as a hard mask above platinum layer 48. As shown in FIG. 16, a photoresist mask 52 is then formed using photolithography. Titanium nitride layer 50 is subsequently etched by RIE or wet etching, which etch stops on platinum layer 48.

Figure 17:
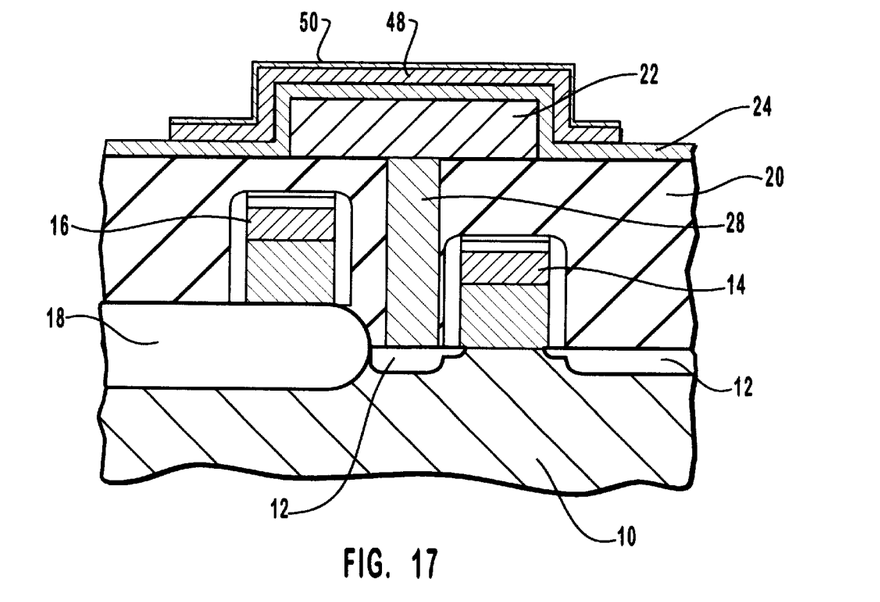
FIG. 17 is a cross-sectional depiction of a MOS stacked memory structure undergoing the method of the present invention and is shown after patterning of the nitride layer, removal of the photoresist layer, and subsequent patterning of the platinum layer.
Figure 18:
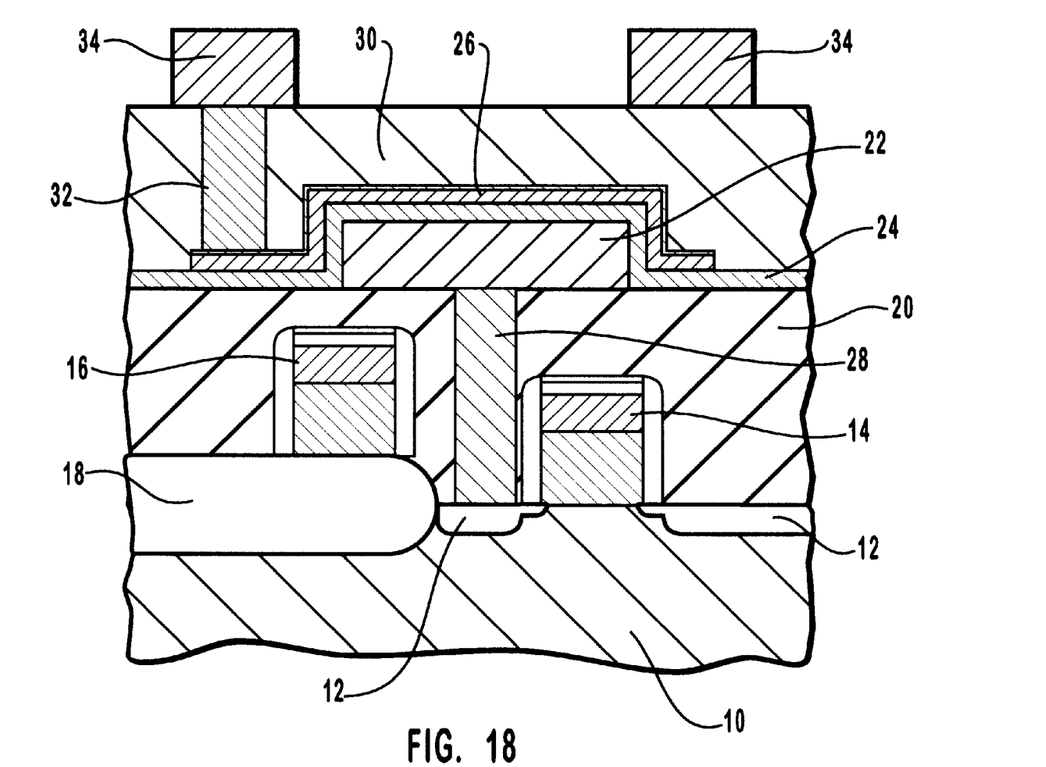
FIG. 18 is a cross-sectional depiction of an MOS stacked memory structure undergoing the method of the present invention and is shown after a passivation layer, metal interconnect lines, and an interconnecting metal plug have been deposited.

As shown in FIG. 17, photoresist mask 52 has been removed. Platinum layer 48 is etched with RIE etching or ion beam milling to form a platinum upper capacitor electrode 26 seen in FIG. 18. The remaining portion of titanium nitride layer 50 is, in one embodiment, allowed to remain in place to act as a diffusion barrier between upper capacitor electrode 26 and metal interconnect layers which will be subsequently deposited. The use of titanium nitride layer 50 as a diffusion barrier is illustrated by the completed capacitor shown in FIG. 18. In completing the capacitor, a $SiO_2$ isolation layer 30 is deposited and is planarized over the completed upper capacitor electrode 26. A contact opening is then etched and filled with tungsten or aluminum to form a plug 32. Plug 32 is connected to other structures by aluminum interconnect lines 34. Titanium nitride layer 50 protects the capacitor during processing and in particular, prevents the platinum of upper capacitor electrode 26 and the material of plug 32 from interdiffusing.

From the foregoing discussion, it is apparent that certain advantages are provided by the present invention which are not available in the methods of the prior art. Due to the initial thinness of titanium nitride layers 44 and 50, which are also partially consumed in the etch process, no redeposition occurs during the construction of lower and upper capacitor electrodes 22 and 26. Consequently, a thinner dielectric or ferroelectric layer can be used with reliability since redeposition problems known in the prior art have been minimized by the inventive method. Furthermore, the sidewalls of lower and upper capacitor electrodes 22 and 26 are etched in a substantially anisotropic manner. This also allows the capacitor structure to be thinner, reducing the need for expensive methods of forming interlevel structures to make electrical connections with the capacitor. Due to the high selectivity of the etch process, the sidewalls of the metal nitride layer are not substantially etched, and as substantially no lateral etching occurs, critical dimensions are maintained such that memory structures and other circuits can be formed with greater device density, thereby substantially aiding in the miniaturization process.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for forming a capacitor, the method comprising:

providing a first film to be etched, the first film being situated upon a semiconductor substrate and being composed of a noble metal;

forming on the first film with a first layer of metal nitride;

forming a bottom capacitor electrode by etching the first film with a physical ion etch process that etches the first film at a higher rate than the first metal nitride layer;

removing the remaining first metal nitride layer;

forming a capacitor dielectric layer on the bottom capacitor electrode;

providing a second film to be etched on the capacitor dielectric layer, the second film being composed of a noble metal;

covering the second film with a second layer of metal nitride;

forming an upper capacitor electrode by etching the second film with a physical ion etch process that etches the second film at a higher rate than the second metal nitride layer.

2. A method as recited in claim 1, wherein, prior to providing said first film to etched, the method further comprises:

forming an active area in the semiconductor substrate;

forming a second electrically insulating layer upon the active area;

forming a second contact hole in the second electrically insulating layer extending to the active area;

forming a second conducting material within the second contact hole; whereby the bottom capacitor is on the second electrically insulating layer, and the second conducting material provides electrical communication from the active area to the bottom capacitor electrode.

3. A method as recited in claim 1, wherein the physical ion etch processes forming the bottom and upper capacitor electrodes are conducted using ionized oxygen.

4. A method as recited in claim 2, wherein the semiconductor substrate has thereon a gate and a second active area, the active area and the second active area being the source/drain regions of the gate.

5. A method as recited in claim 1, wherein the noble metal of the first and second films comprise platinum.

6. A method as recited in claim 1, wherein the first and second metal nitride layers comprise titanium nitride.

7. A method as recited in claim 1, wherein:

the first and second metal nitride layers comprise titanium nitride and each have a thickness in a range of about 100 angstroms to about 200 angstroms; and the first and second films comprise platinum and each have a thickness in a range of about 1000 angstroms to about 3000 angstroms.

8. A method as recited in claim 1, wherein the remaining first metal nitride is removed with a chlorine-based RIE etch.

9. A method as recited in claim 1, wherein the remaining first metal nitride is removed with a fluorine-based RIE etch.

10. A method as recited in claim 1, wherein the remaining first metal nitride is removed with a wet etch.

11. A method as recited in claim 1, further comprising:

providing an electrical isolation layer over the second metal nitride layer;

etching a contact opening through the electrical isolation layer, the contact opening extending down to the second metal nitride layer;

forming a conducting material in the contact opening; and forming an interconnect line providing electrical communication between the upper capacitor electrode and other semiconductor devices situated on the semiconductor substrate, said second metal nitride layer preventing diffusion between the upper capacitor electrode and the conducting material.

12. A method as recited in claim 11, wherein the bottom and upper capacitor electrodes comprise platinum and the first and second metal nitride layers comprise titanium nitride.

13. A method as recited in claim 12, wherein:

the first and second metal nitride layers each have a thickness in a range of about 100 angstroms to about 200 angstroms; and the bottom and upper capacitor electrodes each have a thickness in a range of about 1000 angstroms to about 3000 angstroms.

14. A method as recited in claim 1, further comprising, prior to forming on the bottom capacitor electrode, patterning the first metal nitride layer.

15. A method as recited in claim 14, wherein patterning the first metal nitride layer is conducted using a chlorine-based RIE etch.

16. A method as recited in claim 14, wherein patterning the first metal nitride layer is conducted using a fluorine-based RIE etch.

17. A method as recited in claim 14, wherein patterning the first metal nitride layer is conducted using a wet etch of $H_2O_2:H_2SO_4$.

18. A method as recited in claim 14, wherein patterning the first metal nitride layer is conducted using a wet etch of $H_2O_2:NH_4OH$.

19. A method as recited in claim 1, wherein the physical ion etch processes forming the bottom and upper capacitor electrodes comprise ion beam milling.

20. A method as recited in claim 1, wherein the first and second metal nitride layers comprise a refractory metal nitride.

21. A method as recited in claim 1, wherein, after forming an upper capacitor electrode, the planar dimensions of the upper capacitor electrode is the same as the second metal nitride layer.

22. A method as recited in claim 1, wherein the semiconductor substrate has a plane, and wherein the bottom and upper capacitor electrodes have sidewalls that are orthogonal to the plane of the semiconductor substrate.

23. A method for forming a capacitor, the method comprising:

providing an insulated substrate;

forming a first film, composed of a noble metal, on the insulated substrate;

forming a first layer, composed of a refractory metal nitride, upon the first film;

performing a physical ion etch upon the first layer and the first film to form a bottom capacitor electrode from the first film;

removing the remaining first layer on the bottom capacitor electrode;

forming a capacitor dielectric layer on the bottom capacitor electrode;

forming a second film, composed of a noble metal, on the capacitor dielectric layer;

forming a second layer, composed of a refractory metal nitride, on the second film;

performing a physical ion etch upon the second layer and the second film to form an upper capacitor electrode from the second film on the capacitor dielectric layer.

24. A method as recited in claim 23, wherein the insulated substrate is on a semiconductor substrate having thereon a gate, a first active area, and a second active area, the first active area and the second active area being the source/drain regions of the gate.

25. A method as recited in claim 23, wherein:

the first and second layers each are composed of titanium nitride; and the first and second films each are composed of platinum.

26. A method as recited in claim 25, wherein:

the first and second layers each have a thickness in a range of about 100 angstroms to about 200 angstroms; and the first and second films each have a thickness in a range of about 1000 angstroms to about 3000 angstroms.

27. A method as recited in claim 23, further comprising:

prior to forming the bottom capacitor electrode, patterning the first titanium nitride layer; and prior to forming the upper capacitor electrode, patterning the second titanium nitride layer.

28. A method as recited in claim 23, wherein the physical ion etch processes forming the bottom and upper capacitor electrodes comprise ion beam milling.

29. A method as recited in claim 23, wherein:

after forming the bottom capacitor electrode, the planar dimensions of the bottom capacitor electrode is the same as the first layer; and after forming the upper capacitor electrode, the planar dimensions of the upper capacitor electrode is the same as the second layer.

30. A method as recited in claim 23, wherein the insulated substrate has a plane, and wherein the bottom and upper capacitor electrodes have sidewalls that are orthogonal to the plane of the insulated substrate.

31. A method as recited in claim 23, wherein:

performing the physical ion etch upon the first layer and the first film removes more of the first film than the first layer; and performing the physical ion etch upon the second layer and the second film removes more of the second film than the second layer.

32. A method as recited in claim 23, further comprising:

forming an electrical isolation layer over the second layer;

etching a contact opening through the electrical isolation layer, the contact opening extending down to the second layer;

forming a conducting material in the contact opening; and forming an interconnect line providing electrical communication between the upper capacitor electrode and other semiconductor devices, said second layer preventing diffusion between the upper capacitor electrode and the conducting material.

33. A method as recited in claim 23, further comprising:

prior to forming the first film on the insulated substrate, providing a semiconductor substrate having an active area therein, wherein the insulated substrate is on the active area in semiconductor substrate;

after providing said insulated substrate, forming a contact hole in the insulated substrate extending to the active area and forming a conducting material within the second contact hole, whereby the bottom capacitor electrode is on the insulated substrate, and the conducting material provides electrical communication from the active area to the bottom capacitor electrode.

34. A method for forming a structure having a capacitor, the method comprising:

providing an insulated substrate having a plane and being situated on a semiconductor substrate having thereon a gate, a first active area, and a second active area, the first active area and the second active area being the source/drain regions of the gate;

forming a first film, composed of platinum and having a thickness in a range of about 1000 angstroms to about 3000 angstroms, on the insulated substrate;

forming a first layer, composed of a titanium nitride and having a thickness in a range of about 100 angstroms to about 200 angstroms, upon the first film and having a planar shape;

performing a physical ion etch upon the first layer and the first film to form a bottom capacitor electrode from the first film, the bottom capacitor electrode having the same planar shape as the first layer and being orthogonal to the plane of the insulated substrate;

removing the remaining first layer on the bottom capacitor electrode;

forming a capacitor dielectric layer on the bottom capacitor electrode;

forming a second film, composed of platinum and having a thickness in a range of about 1000 angstroms to about 3000 angstroms, on the capacitor dielectric layer;

forming a second layer, composed of titanium nitride and having a thickness in a range of about 100 angstroms to about 200 angstroms, on the second film;

performing a physical ion etch upon the second layer and the second film to form an upper capacitor electrode from the second film on the capacitor dielectric layer, the upper capacitor electrode having the same planar shape as the second layer and being orthogonal to the plane of the insulated substrate.

35. A method for forming a capacitor, the method comprising:

forming an active area in the semiconductor substrate;

forming a first electrically insulating layer upon the active area;

forming a first contact hole in the first electrically insulating layer extending to the active area;

forming a first conducting material within the first contact hole;

providing a first film to be etched, the first film having a thickness in a range of about 1000 angstroms to about 3000 angstroms and being situated upon the first electrically insulating layer and being composed platinum;

forming a first layer of titanium nitride on the first film having a thickness in a range of about 100 angstroms to about 200 angstroms;

patterning the first layer of titanium nitride so as to have a planar shape;

forming a bottom capacitor electrode by etching the first film with an ion beam milling process that etches the first film at a higher rate than the first metal nitride layer, the bottom capacitor electrode having the same planar shape as the first metal nitride layer, the first conducting material providing electrical communication from the active area to the bottom capacitor electrode;

removing the remaining first titanium nitride layer on the bottom capacitor electrode;

forming a capacitor dielectric layer on the bottom capacitor electrode;

providing a second film to be etched on the capacitor dielectric layer, the second film having a thickness in a range of about 1000 angstroms to about 3000 angstroms and being composed of platinum;

forming a second layer of titanium nitride on the second film having a thickness in a range of about 100 angstroms to about 200 angstroms;

patterning the second layer of titanium nitride to shape a planar shape;

forming an upper capacitor electrode on the capacitor dielectric layer by etching the second film with an ion beam milling process that etches the second film at a higher rate than the second titanium nitride layer, the upper capacitor electrode having the same planar shape as the second metal nitride layer;

providing a second electrical isolation layer over the second titanium nitride layer;

etching a contact opening through the second electrical isolation layer, the contact opening extending down to the second titanium nitride layer;

forming a second conducting material in the contact opening; and forming an interconnect line providing electrical communication between the upper capacitor electrode and other semiconductor devices situated on the semiconductor substrate, said second titanium nitride layer preventing diffusion between the upper capacitor electrode and the second conducting material.

36. A method as recited in claim 35, wherein the semiconductor substrate has thereon a gate and a second active area, the active area and the second active area being the source/drain regions of the gate.

37. A method as recited in claim 35, wherein the semiconductor substrate has a plane, and wherein the bottom and upper capacitor electrodes have sidewalls that are orthogonal to the plane of the semiconductor substrate.

* * * * *

UNITED STATES PATENT AND TRADEMARK OFFICE
CERTIFICATE OF CORRECTION

PATENT NO. : 5,930,639

DATED : July 27, 1999

INVENTOR(S) : Paul Schuele; Brent A. McClure; Thomas M. Graettinger

It is certified that error appears in the above-identified patent and that said Letters Patent are hereby corrected as shown below:

Col. 11, ln. 48: after "planar" change "dimensions" to --dimension--

Signed and Sealed this

Seventeenth Day of April, 2001

Attest:

NICHOLAS P. GODICI

Attesting Officer     *Acting Director of the United States Patent and Trademark Office*

UNITED STATES PATENT AND TRADEMARK OFFICE
CERTIFICATE OF CORRECTION

PATENT NO.    : 5,930,639
DATED         : July 27, 1999
INVENTOR(S)   : Paul Schuele; Brent A. McClure; Thomas M. Graettinger It is certified that error appears in the above-identified patent and that said Letters Patent is hereby corrected as shown below:

<u>Column 1,</u>
Line 8, at the beginning of the patent please add the following:
-- This invention was made with United States Government support under contract No. MDA972-94-C-0006 awarded by the Advanced Research Projects Agency (ARPA). The United States Government has certain rights in this invention. --

Signed and Sealed this

Eighteenth Day of September, 2001

*Attest:*

*Attesting Officer*

NICHOLAS P. GODICI
*Acting Director of the United States Patent and Trademark Office*